(12) United States Patent
Le Saux et al.

(10) Patent No.: US 11,327,339 B2
(45) Date of Patent: May 10, 2022

(54) METHOD OF ORDERING AN OPHTHALMIC LENS AND CORRESPONDING SYSTEM

(71) Applicant: Essilor International, Charenton-le-Pont (FR)

(72) Inventors: Gilles Le Saux, Charenton-le-Pont (FR); Stephane Boutinon, Charenton-le-Pont (FR); Cecile Pietri, Charenton-le-Pont (FR); Helene De Rossi, Charenton-le-Pont (FR)

(73) Assignee: Essilor International, Charenton-le-Pont (FR)

( * ) Notice: Subject to any disclaimer, the term of this patent is extended or adjusted under 35 U.S.C. 154(b) by 240 days.

(21) Appl. No.: 16/080,795

(22) PCT Filed: Mar. 4, 2016

(86) PCT No.: PCT/IB2016/000785
§ 371 (c)(1),
(2) Date: Aug. 29, 2018

(87) PCT Pub. No.: WO2017/149346
PCT Pub. Date: Sep. 8, 2017

(65) Prior Publication Data
US 2019/0056602 A1 Feb. 21, 2019

(51) Int. Cl.
*G02C 7/02* (2006.01)
*G06Q 30/06* (2012.01)
(Continued)

(52) U.S. Cl.
CPC ............ *G02C 7/027* (2013.01); *G02C 7/028* (2013.01); *G06Q 30/06* (2013.01);
(Continued)

(58) Field of Classification Search
CPC ........ G02C 7/027; G02C 7/028; G06Q 30/06; G06Q 30/0601; G06Q 30/0621
(Continued)

(56) References Cited

U.S. PATENT DOCUMENTS 5,173,739 A * 12/1992 Kurachi ............. G01M 11/0235
356/124
5,175,594 A * 12/1992 Campbell .......... G01M 11/0235
356/124
(Continued)

FOREIGN PATENT DOCUMENTS

CN     104160416 A    11/2014
CN     104950470 A     9/2015
(Continued)

OTHER PUBLICATIONS

International Search Report dated Dec. 15, 2016 in PCT/IB2016/000785 filed Mar. 4, 2016.
(Continued)

*Primary Examiner* — James R Greece
(74) *Attorney, Agent, or Firm* — Oblon, McClelland, Maier & Neustadt, L.L.P.

(57) ABSTRACT

A method of ordering an ophthalmic lens comprises the following steps: —obtaining data representative of a desired correction for a wearer's eye; —determining (S6, S8), using an electronic device, a lens power to be measured on a lensmeter based on the obtained data and on at least one parameter defining an expected position of the lens with respect to the wearer's eye, wherein the lens power corresponds to the power measured on the lensmeter for a lens adapted to provide the desired correction to the wearer's eye when placed at the expected position with respect to the (Continued)

wearer's eye; —ordering (S10) the ophthalmic lens specifying the determined power. A corresponding system is also provided.

17 Claims, 2 Drawing Sheets

(51) Int. Cl.
*G02C 7/04* (2006.01)
*G02C 7/06* (2006.01)
*G06F 30/00* (2020.01)

(52) U.S. Cl.
CPC ..... *G06Q 30/0601* (2013.01); *G06Q 30/0621* (2013.01); *G02C 7/04* (2013.01); *G02C 7/061* (2013.01); *G06F 30/00* (2020.01); *G06Q 30/0633* (2013.01)

(58) Field of Classification Search
USPC .................................................. 351/159.74
See application file for complete search history.

(56) References Cited

U.S. PATENT DOCUMENTS

| | | | | |
|---|---|---|---|---|
| 5,247,341 | A * | 9/1993 | Kurachi | G01M 11/0235 356/125 |
| 5,715,032 | A * | 2/1998 | Isenberg | G02C 7/061 351/159.42 |
| 7,118,215 | B2 | 10/2006 | Qi et al. | |
| 8,002,404 | B2 * | 8/2011 | Weatherby | G02C 7/02 351/159.73 |
| 8,295,961 | B2 * | 10/2012 | Daimaru | G06Q 30/0603 33/554 |
| 8,786,675 | B2 * | 7/2014 | Deering | G09G 3/02 348/46 |
| 2003/0123026 | A1 * | 7/2003 | Abitbol | G06Q 30/0641 351/204 |
| 2003/0231282 | A1 | 12/2003 | Saux et al. | |
| 2004/0032565 | A1 | 2/2004 | Yamakaji et al. | |
| 2005/0225720 | A1 * | 10/2005 | Ridings | A61B 3/032 351/200 |
| 2006/0023163 | A1 * | 2/2006 | Foster | A61B 3/18 351/246 |
| 2006/0290885 | A1 * | 12/2006 | Covannon | A61F 9/008 351/212 |
| 2008/0189173 | A1 * | 8/2008 | Bakar | A61B 3/005 705/14.14 |
| 2009/0310084 | A1 * | 12/2009 | Foster | A61B 3/18 351/223 |
| 2010/0026955 | A1 * | 2/2010 | Fisher | G02C 13/003 351/205 |
| 2010/0033678 | A1 * | 2/2010 | Foster | A61B 5/411 351/223 |
| 2010/0114540 | A1 | 5/2010 | Shinohara et al. | |
| 2010/0128220 | A1 * | 5/2010 | Chauveau | G02C 13/003 351/204 |
| 2010/0195045 | A1 | 8/2010 | Nauche et al. | |
| 2010/0208207 | A1 * | 8/2010 | Connell, II | G06K 9/0061 351/210 |
| 2011/0007269 | A1 * | 1/2011 | Trumm | G02C 13/005 351/204 |
| 2012/0188507 | A1 * | 7/2012 | Foster | A61B 3/18 351/205 |
| 2013/0339043 | A1 * | 12/2013 | Bakar | G06Q 50/22 705/2 |
| 2014/0002799 | A1 * | 1/2014 | Wildsmith | A61B 3/0025 351/223 |
| 2014/0218682 | A1 * | 8/2014 | Foster | A61B 3/10 351/205 |
| 2015/0019389 | A1 * | 1/2015 | Leonard | G16H 20/10 705/27.2 |
| 2015/0049306 | A1 * | 2/2015 | Haddadi | A61B 3/14 351/206 |
| 2015/0055085 | A1 * | 2/2015 | Fonte | G06F 30/00 351/178 |
| 2015/0077704 | A1 | 3/2015 | Carmon et al. | |
| 2015/0277150 | A1 | 10/2015 | Granger et al. | |
| 2016/0026001 | A1 | 1/2016 | Nishimura et al. | |
| 2017/0109568 | A1 | 4/2017 | Escalier | |

FOREIGN PATENT DOCUMENTS

| | | |
|---|---|---|
| CN | 105190411 A | 12/2015 |
| DE | 10 2008 035 247 A1 | 2/2010 |
| EP | 1 376 202 A1 | 1/2004 |
| EP | 2 923 826 A1 | 9/2015 |
| FR | 2 914 173 A1 | 10/2008 |
| FR | 3 021 443 A1 | 11/2015 |
| JP | 2002-162607 A | 6/2002 |
| JP | 2006-163441 A | 6/2006 |
| JP | 2009-9167 A | 1/2009 |
| JP | 2011-39552 A | 2/2011 |
| WO | WO 2007/017766 A2 | 2/2007 |
| WO | WO 2008/129168 A1 | 10/2008 |
| WO | WO 2013/128439 A1 | 9/2013 |
| WO | WO 2014/133166 A1 | 9/2014 |

OTHER PUBLICATIONS

Japanese Office Action dated Jan. 28, 2020 in Japanese Patent Application No. 2018-544315 (with English translation), 8 pages.
Office Action dated Mar. 12, 2021 in China Patent Application No. 201680082996.2 (with English translation); 15 pgs.

* cited by examiner

METHOD OF ORDERING AN OPHTHALMIC LENS AND CORRESPONDING SYSTEM

TECHNICAL FIELD OF THE INVENTION

The invention relates to the field of correction of an individual's ametropia thanks to ophthalmic lenses.

More precisely the invention relates to a method of ordering an ophthalmic lens and to a corresponding system.

BACKGROUND INFORMATION AND PRIOR ART

When ordering an ophthalmic lens, an optician generally specifies the desired power for the lens as prescribed by an ophthalmologist or an optometrist.

For lenses having a particular shape, or to be mounted on a particular frame, the optician also indicates parameters representative of the position of the lens before the wearer's eye. This makes it possible for the lens manufacturer to design a lens which will produce the correction sought, although placed in a particular manner before the eye.

This has the consequence however that the lens power measured by the optician on a lensmeter (when checking the lens received from the manufacturer) then generally differs from the prescribed power.

For this reason, when delivering the lens, the manufacturer may sometimes indicate the expected power to be measured on a lensmeter, in addition to the prescribed power (which was specified in the order), which may however occasionally lead to confusion.

SUMMARY OF THE INVENTION

In this context, the invention provides a method of ordering an ophthalmic lens comprising the following steps:
  obtaining data representative of a desired correction for a wearer's eye;
  determining, using an electronic device, a lens power to be measured on a lensmeter based on the obtained data and on at least one parameter defining an expected position of the lens with respect to the wearer's eye;
  ordering the ophthalmic lens specifying the determined power.

The refractive power value used as a reference by the ordering party and the lens provider is thus also the power to be measured by the ordering party on a lensmeter when verifying the received lens, which avoids any risk of confusion.

According to possible (thus non-limiting) features:
  the determined lens power corresponds to the power measured on the lensmeter for a lens adapted to provide the desired correction to the wearer's eye when placed at the expected position with respect to the wearer's eye;
  said parameter is representative of a distance between the lens and the wearer's eye;
  said parameter is representative of an orientation of the lens with respect to the wearer's eye;
  determining the lens power to be measured is also based on a characteristic of the lens, which characteristic of the lens is for instance representative of a shape of at least part of the lens or a refraction index of a material forming the lens;
  the step of determining the lens power to be measured comprises using a ray-tracing method;
  the step of determining the lens power to be measured comprises reading said lens power to be measured in a look-up table;
  said data representative of the desired correction for the wearer's eye comprise refractive power values determined during a subjective refraction test;
  said data representative of the desired correction for the wearer's eye comprise data representative of the wearer's head position with respect to a refraction apparatus when determining said desired correction by means of said refraction apparatus;
  the method further comprises a step of designing the ophthalmic lens such that the designed ophthalmic lens provides the determined power as measured on the lensmeter;
  the method further comprises a step of selecting an ophthalmic lens having a measured power on a lensmeter close to the determined power.

The invention also provides a system for ordering an ophthalmic lens (located for instance in the premises of an optician), comprising:
  an input module for obtaining data representative of a desired correction for a wearer's eye;
  an electronic device designed to determine lens power to be measured on a lensmeter based on the obtained data and on at least one parameter defining an expected position of the lens with respect to the wearer's eye;
  a communication module for electronically ordering the ophthalmic lens specifying the determined power.

The input module may be a user interface, in which case said data representative of the desired correction for the wearer's eye may be entered by a user of the system (e.g. the optician), or a (software) tool adapted to retrieve said data from a database, for instance from a remote data base.

DETAILED DESCRIPTION OF EXAMPLE(S)

Figure 1:
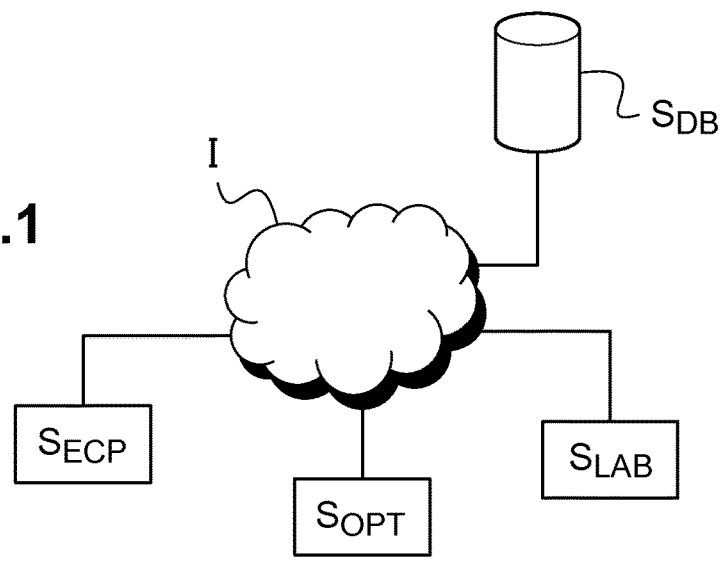
FIG. 1 shows an exemplary system in which the invention may be implemented.

The system shown in FIG. 1 includes an eye-care-professional computer system $S_{ECP}$, an optician computer system $S_{OPT}$, a manufacturing-lab computer system $S_{LAB}$ and a database computer system $S_{DB}$.

Each of these computer systems $S_{ECP}$, $S_{OPT}$, $S_{LAB}$, $S_{DB}$ includes a processor (for instance a microprocessor) and a storage device (such as a solid-state memory or a hard disk drive). In each computer system $S_{ECP}$, $S_{OPT}$, $S_{LAB}$, $S_{DB}$, the storage device stores computer program instructions that are executable by the processor such that the concerned computer system $S_{ECP}$, $S_{OPT}$, $S_{LAB}$, $S_{DB}$ may perform methods, including the methods described below for the concerned computer system, when these instructions are executed by the processor.

Each of these computer systems $S_{ECP}$, $S_{OPT}$, $S_{LAB}$, $S_{DB}$ also includes a communication module making it possible to connect the concerned computer system $S_{ECP}$, $S_{OPT}$, $S_{LAB}$, $S_{DB}$ to a communication network I, such as the Internet, and to exchange data with any other of the computer systems $S_{ECP}$, $S_{OPT}$, $S_{LAB}$, $S_{DB}$ via this communication network I. Data exchanges between the computer systems $S_{ECP}$, $S_{OPT}$, $S_{LAB}$, $S_{DB}$ may be encrypted by known means to ensure confidentiality of the exchanged data.

The eye-care-professional computer system $S_{ECP}$ is for instance located in the premises of an optometrist or an ophthalmologist. According to possible alternative embodiments mentioned below, an eye care professional may not have his/her own computer system; prescription data provided by such an eye care professional may be communicated to the optician in the form of a paper prescription.

In FIG. 1, the database computer system $S_{DB}$ is represented as a remote server, distinct for instance from the optician computer system $S_{OPT}$ and from the manufacturing-lab computer system $S_{LAB}$. In possible embodiments however, the database computer system $S_{DB}$ may be implemented jointly with the optician computer system $S_{OPT}$ or the manufacturing-lab computer system $S_{LAB}$, i.e. data stored in the database computer system $S_{DB}$ as described below may be stored in the optician computer system $S_{OPT}$ or in the database computer system $S_{DB}$.

Figure 2:
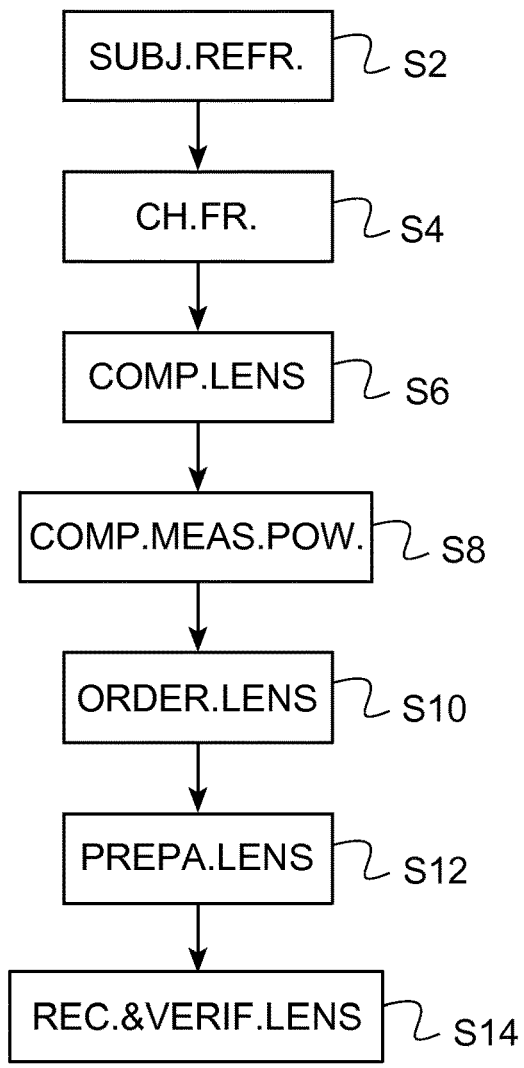
FIG. 2 shows a method for providing a lens to an individual, including steps in accordance with the invention.

FIG. 2 shows a method for providing a lens to an individual in order to compensate for the individual's ametropia.

This method starts at step S2 when an eye care professional, such as an ophthalmologist or an optometrist, performs a test of the individual's eye called "subjective refraction". An objective refraction, using an autorefractor or an aberrometer, may also be used as an alternative to the subjective refraction test.

During this test, the individual's eye is placed in front of the eyepiece of a refraction apparatus and the individual looks through the refraction apparatus.

The eye care professional may then modify the refractive power of the refraction apparatus in order to find a refractive power that provides the best correction for the individual.

Thus, for each eye of the individual, this test makes it possible to determine a refractive power to be provided to the individual, defined by the following prescription data: spherical refractive power S and/or cylindrical refractive power C and/or cylinder axis A. These refractive power values are generally known as "refraction values" and correspond to a desired correction of the individual's ametropia.

The subjective refraction test may be performed for a plurality of types of vision (e.g. distance vision and near vision), corresponding to a plurality of gaze direction, respectively.

The prescription data obtained thanks to the subjective refraction test may thus include, for each eye e and for each vision type t, a spherical refractive power $S_{e,t}$, a cylindrical refractive power $C_{e,t}$ and cylinder axis $A_{e,t}$.

In practice, prescription data for types of vision distinct from the distance vision (e.g. for the near vision) are generally presented by comparison with prescription data for the distance vision: for an eye e, prescription data includes a spherical refractive power $S_{e,d}$ and a cylindrical refractive power vector $\vec{C}_{e,d}$ for the distance vision (the cylindrical refractive power vector $\vec{C}_{e,d}$ defining the cylindrical refractive power $C_{e,d}$ and the cylinder axis $A_{e,d}$), the equivalent spherical power addition $EA_e$ for the other type of vision (e.g. for the near vision) and the vector variation $\vec{VC}_e$, for the other type of vision, of the cylindrical refractive power vector $\vec{C}_{e,d}$.

It is proposed here to take into account, as further explained below, the position of the individual's head with respect to the refraction apparatus during the subjective refraction test (for each eye and for each gaze direction). Parameters representing the position of the individual's head with respect to the refraction apparatus are thus measured during the subjective refraction test and recorded.

Figure 3:
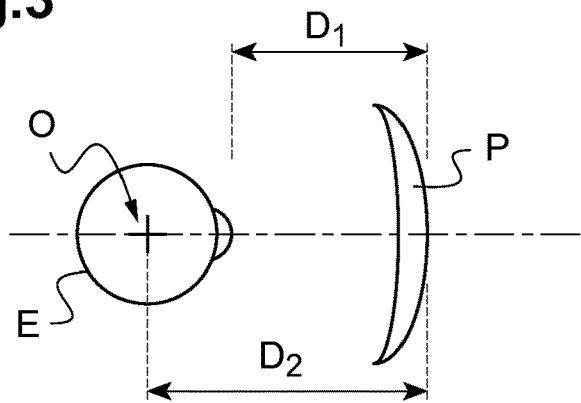
FIG. 3 shows the positioning of the individual's eye with respect to a lens of a refraction apparatus when performing a subjective refraction.

Thus, according to a possible embodiment, the distance $D_1$ between the cornea of the eye E under test and the optically active part P (e.g. a lens) of the refraction apparatus (see FIG. 3) may be determined and recorded.

In practice, such a determination is for instance performed by measuring a distance between the cornea and the eyepiece (e.g. using an image capturing device affixed to the refraction apparatus) and by adding thereto the known distance between the eyepiece and the optically active part.

According to other possible embodiments, other parameters defining the position of the individual's head with respect to the refraction apparatus may be considered, such as a distance $D_2$ between the centre O of rotation of the eye E under test and the optically active part P of refraction apparatus, and/or a yaw angle of the individual's head with respect to the refraction apparatus, and/or a roll angle of the individual's head with respect to the refraction apparatus.

In a possible embodiment, the position of the individual's head with respect to the refraction apparatus may be defined by three coordinates defining the location of the individual's head with respect to the refraction apparatus and three angles defining the orientation of the individual's head with respect to the refraction apparatus.

The parameters defining the position of the individual's head with respect to the refraction apparatus may be obtained for instance by use of a posture analysing device as described in the French patent application published as FR 3 021 443.

It may also be possible to use an average eye rotation centre position, in particular for the distance from the eye rotation centre to the refraction apparatus, for left eye and right eye. Using average eye rotation centre position for both eyes reduces complexity, without impairing accuracy for most refractive power values.

The distance between the centre of rotation of the left eye and the centre of rotation of the right eye may also be measured and recorded.

In order to define the position of the individual's head with respect to the refraction apparatus (e.g. by three coordinates and three angles as mentioned above), use can be made of a three-dimensional frame of reference R linked to the individual's head and defined as follows:
its origin $O_{REF}$ is the midpoint between the centre $O_L$ of rotation of the left eye and the centre $O_R$ of rotation of the right eye;
its first axis X passes through both centres of rotation $O_L$, $O_R$;
its second axis Y lies in the sagittal plane;
its third axis Z corresponds to the primary gaze direction.

The respective positions of the centres of rotation $O_L$, $O_R$ of the eyes may be determined for instance using the method described in the French patent application published as FR 2 914 173.

Hence, by using a measurement apparatus having a fixed position with respect to the refraction apparatus and adapted to determine the respective positions of the centres of rotation and thus the position of the frame of reference R, it is possible to determine the position of the refraction apparatus (represented e.g. by three coordinates and three angles) in the frame of reference R, i.e. to obtain parameters defining the position of the individual's head with respect to the refraction apparatus.

According to a possible embodiment, the actual gaze direction of each eye during the subjective refraction test may be measured and recorded for each type of vision (distance vision, intermediate vision and near vision, for example).

The various data obtained during the subjective refraction as explained above (i.e. in particular, for each eye and for each gaze direction considered, data defining the refractive power to be provided to the individual and data defining the position of the individual's head with respect to the refraction apparatus) may then be entered in the eye-care-professional computer system $S_{ECP}$ and transmitted to the database computer system $S_{DB}$ where it is stored, e.g. in association with an identifier of the concerned individual (possibly in the form of a matrix barcode).

As already noted, in possible embodiments, these data may however be written by the eye care professional on a paper prescription to be later given to the optician by the individual.

The method of FIG. 2 continues at step S4, where the individual chooses a frame at an optician's. This frame is meant to carry a pair of ophthalmic lenses, each lens being designed to provide the individual with the refractive power mentioned above, as explained below.

Figure 4:
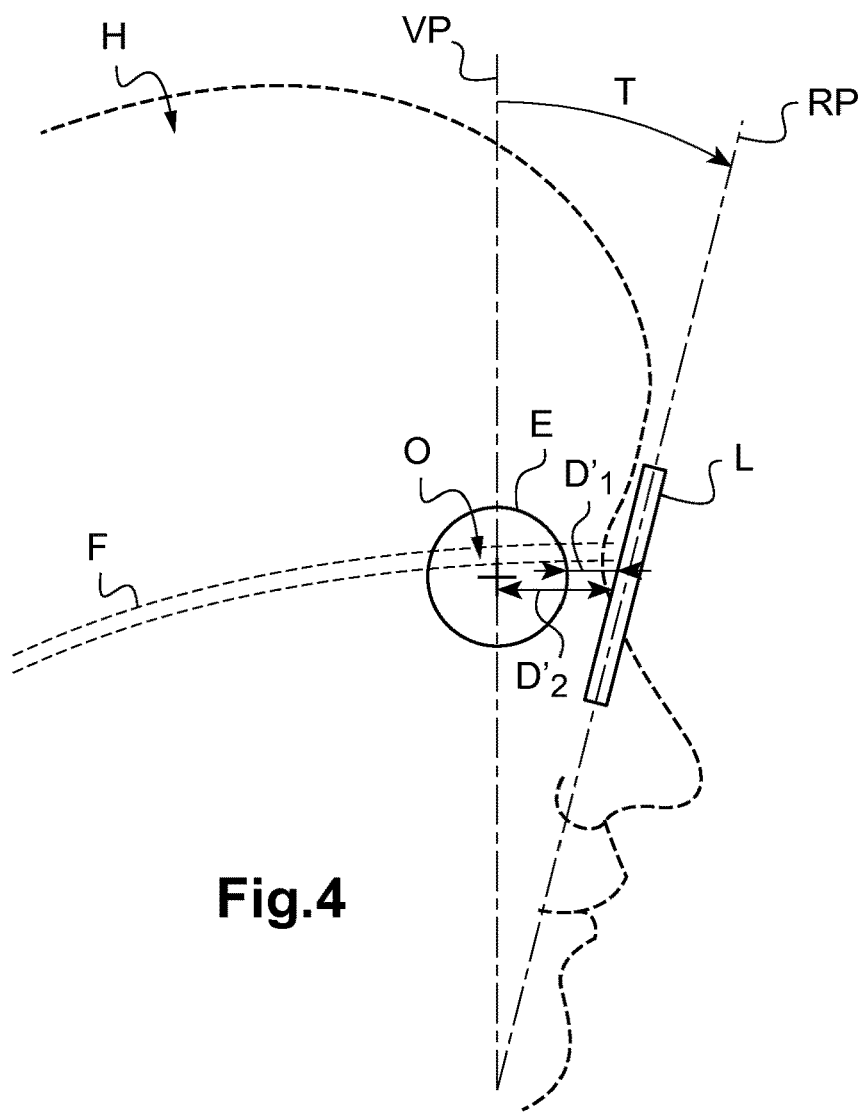
FIG. 4 shows a frame chosen by the individual positioned on the individual's head.

When worn by the individual as shown in FIG. 4, the frame F has a position with respect to the individual's head H, which position may be defined by several parameters, such as a distance between one of the individual's eye E and the corresponding lens L carried by the frame F, a face form angle and a tilt angle T.

The distance between the eye E and the lens L considered may be for instance the distance $D'_2$ between the centre O of rotation of the eye E and the lens L, or, as a variation, the distance $D'_1$ between the cornea and the lens L.

The face form angle is the angle between a mean vertical plane of a rim of the frame and a vertical plane that is perpendicular to the sagittal plane of the individual's head.

The tilt angle T is the angle between a plane RP containing the rim and a vertical plane VP (containing for instance the centre O of rotation of the corresponding eye).

The values of such parameters for the frame chosen by the individual may be measured during step S4 using for instance a measurement device as described in the PCT application published as WO 2008/129 168.

The measured values can then be stored in the optician computer system $S_{OPT}$ (either by being entered on the optician computer system $S_{OPT}$ or by being automatically transferred thereto by the measurement device), and possibly be transmitted to the database computer system $S_{DB}$ for remote storage in association with the individual's identifier.

In the embodiments where data obtained in the subjective refraction step S2 are communicated to the optician using a paper prescription, these data may also be entered in the optician computer system $S_{OPT}$ at this stage using an input module (such as a user interface) and possibly transmitted to the database computer system $S_{DB}$ for remote storage.

According to a possible variation, parameters relating to the position of the frame with respect to the individual's head can be evaluated, for instance by simulating the positioning of the frame on the individual's head and/or based on predetermined values associated with the chosen frame.

Then, in step S6, the optician selects a type of lens (for instance among a list of possible types of lens) and launches a first tool (here a software tool executed on the optician computer system $S_{OPT}$) designed to determine (e.g. compute) parameters characterising each of the ophthalmic lenses to be mounted in the chosen frame in order to obtain the refractive power needed to compensate for the individual's ametropia. In some embodiments (wherein these parameters are not used when ordering the lens), this first tool can be implemented during step S12 described below.

The type of lens (e.g. spherical, bifocal, progressive) is chosen by the optician depending on the prescription and on the individual's preferences.

Precisely, for each eye of the individual, the first tool is designed to compute these parameters characterising the lens based on:
- refractive power values obtained (possibly for a plurality of gaze direction) during the subjective refraction test,
- parameters representing the relative position of the refraction apparatus with respect to the eye rotation centre during the subjective refraction test (possibly with specific values for each of the gaze direction tested),
- parameters representing the position of the frame with respect to the individual's head, and
- characteristics of the selected type of lens (such as material and/or thickness and/or lens shape such as lens front or back curvature and/or optical design of the lens).

Refractive power values may for instance be retrieved from the database computer system $S_{DB}$ (based e.g. on the individual's identifier mentioned above).

Parameters representing the relative position of the refraction apparatus with respect to the eye rotation centre O during the subjective refraction test may also be retrieved from the database computer system SDB when measurements of the position of the individual's head with respect to the refraction apparatus made during step S2 take into account the position of the eye rotation centre O (such as the distance D2 mentioned above between the centre O of rotation of the eye E under test and the optically active part P of refraction apparatus).

However, when measurements of the position of the individual's head with respect to the refraction apparatus made during step S2 (and obtainable from the database computer system SDB) do not take into account the position of the eye rotation centre O (e.g. here when measuring the distance D1 between the cornea of the eye E under test and the optically active part P of the refraction apparatus), a measurement of the (e.g. three-dimensional) position of the eye rotation centre O is made by the optician in step S4 so as to be able to locate this eye rotation centre O with respect to the individual's head (in particular with respect to the part of the head, here the cornea, used as reference to define the position of the individual's head with respect to the refraction apparatus in step S2) and thus to obtain the position of the eye rotation centre O and the position of the refraction apparatus during the subjective refraction in the same three-dimensional frame of reference, e.g. the frame of reference R mentioned above.

The first tool is designed to determine the parameters characterising the lens in such a manner that, for each gaze direction considered, the refractive power provided by the lens when mounted in the frame (supposedly positioned on the individual's head) is identical to the refractive power provided by the refraction apparatus during the subjective refraction test (this refractive power being determined from the refraction values, represented by first data, and the parameters representing the relative position of the refraction apparatus with respect to the eye rotation centre O during the subjective refraction test).

The refractive power provided by the refraction apparatus may be determined from the first data representative of refraction values and from the relative position of the refraction apparatus with respect to the eye rotation centre in the following way:

If the equivalent spherical power (refraction value) represented by the first data is noted Sa, the equivalent spherical power Sam of the refractive power provided by the refraction apparatus can be determined as follows:

$$1/Sam = 1/Sa - D_2 \quad (1).$$

If the equivalent spherical power of the refractive power provided by the lens is noted Sl, the equivalent spherical power Slm of the refractive power provided by the lens taking account of the parameters representing the position of the frame with respect to the individual's head can be determined as follows:

$$1/Slm = 1/Sl - D_2' \quad (2).$$

If the distance $D_2'$ is not determined, a standard value, for example $D_2' = 27$ mm, can be used instead.

Cylindrical refractive power can be handled in a similar manner by applying the above formulae to the minimum and maximum refractive power.

As explained above, the lens is thus designed so that Slm=Sam for a spherical lens or, when the lens has cylinder, such that minimum and maximum power are equal for the refractive power provided by the lens and the refractive power provided by the refraction apparatus using formulae (1) and (2).

It should be noted that the determination of the refractive power provided by the refraction apparatus may be done in previous step, for example step S2 mentioned above. In this case, the optometrist or ophthalmologist conducting the refraction in step S2 may transmit this refractive power to the optician, and it is not necessary in this case to transmit to the optician the relative position of the refraction apparatus with respect to the eye rotation centre.

This last example corresponds to the case when the first data mentioned above are representative of power provided by the refraction apparatus at the eyepiece position.

The refractive power may also include high order optical aberration (coma, trefoil, etc.), when the refraction instrument is for example an aberrometer. In this case, it is proposed, using for example ray tracing, to calculate the propagation of the initial optical wavefront from the eyepiece of the aberrometer to the position of the eye rotation centre. This particularly applies when the wavefront measured by the aberrometer is determined at the eyepiece position. The initial wavefront can be a sum of Zernicke polynoms, and the propagated wavefront is then also a sum of Zernicke polynoms having coefficients different form the initial wavefront.

In addition, the equivalent spherical power of the refractive power may also take account of the real distance of the target used when performing the subjective refraction test. For example, if the far vision distance used is DtargetFV, the equivalent spherical power S' for far vision may be modified in the following way: S"=S'−1/DtargetFV. If the equivalent spherical EAe' is determined at a near distance DtargetNV different from a reference near vision distance Dtar-getNVref, the modification can be as follows: EAe"=EAe'−(1/DtargetNV−1/DtargetNVref).

The parameters characterising the lens may be computed in practice using a ray tracing method or a method such as described in the PCT application published under WO 2007/017 766.

The computations just mentioned may be performed by the optician computer system $S_{OPT}$ (where the software tool is executed), or may be performed (totally or in part) by a (dedicated) remote computer system (connected to the optician computer system $S_{OPT}$).

According to a possible variation, parameters characterising the lens are pre-computed for (a great number of) possible values of refractive power obtained during the subjective refraction test, for possible values of parameters representing the position of the individual's head with respect to the refraction apparatus during the subjective refraction test, for possible values of parameters representing the position of the frame with respect to the individual's head, and for possible characteristics of the possible types of lenses. Pre-computed values are stored in look-up tables in the optician computer system $S_{OPT}$ or in the database computer system $S_{DB}$.

In such embodiments, step S6 includes reading the parameters characterising the lens stored in the look-up tables just mentioned in association with:

refractive power values obtained during the subjective refraction test (step S2), parameters representing the relative position of the refraction apparatus with respect to the eye rotation centre O during the subjective refraction test (step S2), parameters representing the position of the frame with respect to the individual's head (measured in step S4), and characteristics of the type of lens selected in step S6.

The optician can then launch at step S8 a second tool (here a software tool executed by the optician computer system $S_{OPT}$) designed to determine the power to be measured on a lensmeter (or focimeter) for a lens as defined by the parameters determined in step S6 (this determination being performed for both lenses to be mounted on the selected frame).

These parameters include for instance one or several of the following parameters: a distance between the lens and the wearer's eye and/or an orientation of the lens with respect to the wearer's eye (both derived from the parameters representing the position of the frame with respect to the individual's head), a refractive power of the lens, a shape and/or geometry of at least part of the lens, a refraction index of a material forming the lens, an optical design.

The determination of the power to be measured on a lensmeter can be done for instance in practice by simulating a bundle of parallel light rays of small diameter (e.g. 4 mm) entering a front face of the lens (the rear face of the lens being perpendicular to the light rays where crossed by the light rays), by determining the focus based on the wave front of the light rays at the rear face and by determining the power to be measured based on the distance between the rear face and the determined focus. In particular, this simulation can be done using determined parameters characterising the lens if available from the first tool mentioned above.

According to a possible variation, the power to be measured on a lensmeter may be determined by reading the relevant record in a look-up table storing predetermined power values each associated with a given set of values of the parameters determined in step S6. Each power value in the look-up table may be obtained previously either by simulating the effect of a lens defined by the concerned set of parameters or by measuring on a lensmeter the power of a lens designed as defined by the concerned set of parameters.

The determined power (in dioptres) may be rounded to the nearest quarter dioptre (e.g. 1,3D is rounded to 1,25D), or eighth dioptre (e.g. 1,15D is rounded to 1,125D).

The optician then orders the ophthalmic lenses at step S10 specifying, for each ophthalmic lens, the power determined in step S8 (power to be measured on a lensmeter).

The ophthalmic lenses are for instance ordered electronically by sending an electronic order from the optician computer system $S_{OPT}$ to the manufacturing-lab computer system $S_{LAB}$.

The order may also include complementary data, such as the type of lens selected in step S6 and/or the parameter(s) characterising the lens as determined in step S6. These complementary data may include parameters representing the position of the frame with respect to the individual's head, as determined in step S4, particularly when the lens is a progressive lens.

The ordered lenses are then prepared by the manufacturing lab at step S12.

In some embodiments, this merely amounts to collect, in a stock of prefabricated lens, a lens having a refractive power (as measured on a lensmeter) equal to the power specified in the order (in particular when this power is rounded to the nearest quarter or eighth dioptre as proposed above), or a lens which refractive power is the nearest to the power specified in the order.

In other embodiments (e.g. for progressive lenses), this involves designing a lens that matches the constraints defined in the order and manufacturing the designed lens.

For instance, in the case of a progressive lens, the order includes the above-mentioned refractive power to be measured on a lensmeter and an addition to be measured on the lensmeter (defining the lens for a gaze direction corresponding to near vision).

The rear face of the lens (and/or the front face of the lens) can thus be designed (for instance by simulation using ray tracing) such that the refractive power provided by this face (as measured on a lensmeter) in a first region corresponding to distance vision equals then refractive power mentioned in the order, and such that the refractive power provided by this face (as measured on a lensmeter) in a second region corresponding to near vision equals the refractive power defined by the addition mentioned in the order.

The prepared lenses are packed and sent to the optician.

When the order specifies the refractive power to be measured on a lensmeter, it is proposed here that the pack carrying a lens only indicates the refractive power to be measured for this lens on a lensmeter.

The optician receives the lenses at step S14, with the indication of the refractive power to be measured on a lensmeter for each lens.

The optician can thus place each lens on his/her own lensmeter and verify that the refractive power of the concerned lens measured by the lensmeter corresponds to the value indicated on the pack (and thus to the value specified in the order).

As the only refractive power value used when ordering and when verifying is the value to be measured on the lensmeter, there is no risk of mixing with another refractive power value characterising the lens.

According to a possible variation, the refractive power value may also be determined using additional parameters, for example using the known optical combination of the lenses used in the refractive apparatus. It is indeed possible, using for example ray tracing calculation, to determine the exact refractive power provided by the refractive apparatus.

Ray tracing may use simulated bundle of light rays, starting from a source situated at a position corresponding to the position of the visual stimulus when the refraction is performed, then the bundle of light rays is propagated through the different optical componants (lens, mirror, etc.) of the refraction apparatus, having the optical characteristic and position used during refraction, and then propagated until the eye rotation centre.

This allows an higher accuracy for the refraction power value measurement, in particular when using trial frames or phoropter for which the sum of the power of the lenses used to make the refraction is not exactly equal to the power provided by this combination.

The invention claimed is:

1. A method of ordering an ophthalmic lens, comprising:
obtaining prescription data representative of a desired correction for a wearer's eye and at least one parameter representing a position, with respect to the wearer's head, of a frame designed to carry the ophthalmic lens, said prescription data including a refractive power;
deriving, from said at least one parameter representing the position of the frame with respect to the wearer's head, at least one parameter defining an expected position of the lens with respect to the wearer's eye;
determining, using an electronic device, a lens power to be measured on a lensmeter based on the refractive power and on the at least one parameter defining an expected position of the lens with respect to the wearer's eye, said determined lens power being distinct from said refractive power:
ordering the ophthalmic lens specifying the determined lens power;
receiving the ophthalmic lens with an indication of the deteiniined lens power; and
measuring a refractive power of the received ophthalmic lens using the lensmeter and verifying therefrom that the measured refractive power corresponds to said determined lens power.

2. The method according to claim 1, wherein the determined lens power corresponds to the power measured on the lensmeter for a lens adapted to provide the desired correction to the wearer's eye when placed at the expected position with respect to the wearer's eye.

3. The method according to claim 1, wherein said parameter is representative of a distance between the lens and the wearer's eye.

4. The method according to claim 1, wherein said parameter is representative of an orientation of the lens with respect to the wearer's eye.

5. The method according to claim 1, wherein determining the lens power to be measured is also based on a characteristic of the lens.

6. The method according to claim 5, wherein said characteristic of the lens is representative of a shape of at least part of the lens.

7. The method according to claim 5, wherein said characteristic of the lens is a refraction index of a material forming the lens.

8. The method according to claim 1, wherein the determining of the lens power to be measured comprises using a ray-tracing method.

9. The method according to claim 1, wherein the determining of the lens power to be measured comprises reading said lens power to be measured in a look-up table.

10. The method according to claim 1, wherein said data representative of the desired correction for the wearer's eye comprise refractive power values determined during a subjective refraction test.

11. The method according to claim 1, wherein said data representative of the desired correction for the wearer's eye comprise data representative of the wearer's head position with respect to a refraction apparatus when determining said desired correction by said refraction apparatus.

12. The method according to claim 1, further comprising designing the ophthalmic lens such that the designed ophthalmic lens provides the determined power as measured on the lensmeter.

13. The method according to claim 1, further comprising selecting an ophthalmic lens having a measured power on a lensmeter close to the determined power.

14. A system, comprising:
- an input module for obtaining prescription data representative of a desired correction for a wearer's eye and at least one parameter representing position, with respect to the wearer's head, of a frame designed to carry an ophthalmic lens, said prescription data including a refractive power;
- an electronic device designed to derive, from said at least one parameter representing the position of the frame with respect to the wearer's head, at least one parameter defining an expected position of the lens with respect to the wearer's eye, and to determine a lens power based on the refractive power and on the at least one parameter defining an expected position of the lens with respect to the wearer's eye, said determined lens power being distinct from said refractive power;
- a communication module for electronically ordering the ophthalmic lens specifying the determined lens power; and
- a lensmeter configured to measure a refractive power of the ophthalmic lens received with an indication of said determined lens power and verifying therefrom that the measured refractive power corresponds to said determined lens power.

15. The system according to claim 14, further comprising a measurement device suitable for measuring said at least one parameter representing the position of the frame with respect to the wearer's head.

16. The method according to claim 1, further comprising measuring said at least one parameter representing the position of the frame with respect to the wearer's head.

17. A method of ordering an ophthalmic lens, comprising:
- obtaining prescription data representative of a desired correction for a wearer's eye, said prescription data including a refractive power;
- determining, using an electronic device, a lens power to be measured on a lensmeter based on the refractive power and on at least one parameter defining an expected position of the lens with respect to the wearer's eye, said determined lens power being distinct from said refractive power;
- ordering the ophthalmic lens using a communication module and specifying the determined lens power;
- receiving the ophthalmic lens with an indication of the determined lens power; and
- measuring a refractive power of the received ophthalmic lens using the lensmeter and verifying therefrom that the measured refractive power corresponds to said determined lens power.

* * * * *